(12) United States Patent
Kurosawa

(10) Patent No.: US 11,973,000 B2
(45) Date of Patent: Apr. 30, 2024

(54) HEAT DISSIPATION PLATE AND SEMICONDUCTOR DEVICE

(71) Applicant: SHINKO ELECTRIC INDUSTRIES CO., LTD., Nagano (JP)

(72) Inventor: Takuya Kurosawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 234 days.

(21) Appl. No.: 17/543,572

(22) Filed: Dec. 6, 2021

(65) Prior Publication Data
US 2022/0181231 A1 Jun. 9, 2022

(30) Foreign Application Priority Data
Dec. 9, 2020 (JP) .................. 2020-204355

(51) Int. Cl.
*H01L 23/367* (2006.01)
*H01L 23/373* (2006.01)
(Continued)

(52) U.S. Cl.
CPC ...... *H01L 23/3675* (2013.01); *H01L 23/3736* (2013.01); *H01L 23/13* (2013.01);
(Continued)

(58) Field of Classification Search
CPC . H01L 23/3675; H01L 23/3736; H01L 24/32; H01L 24/73; H01L 2224/32245; H01L 2224/73204; H01L 2224/73253; H01L 24/16; H01L 24/29; H01L 25/0655; H01L 2224/33181; H01L 23/4334; H01L 2224/16238; H01L 2224/32225; H01L 2224/83191; H01L 2224/83204; H01L 2224/92225; H01L 2924/15311; H01L 2924/16152; H01L 2924/1616; H01L 2924/16235; H01L 2924/16251;
(Continued)

(56) References Cited

U.S. PATENT DOCUMENTS

2007/0152321 A1* 7/2007 Shi ................ H01L 25/0655
257/E23.101
2013/0043581 A1* 2/2013 Negoro ............... H01L 23/36
257/E23.08
(Continued)

FOREIGN PATENT DOCUMENTS

JP 2013-077598 A 4/2013

*Primary Examiner* — Patricia D Valenzuela
(74) *Attorney, Agent, or Firm* — TAROLLI, SUNDHEIM, COVELL & TUMMINO L.L.P.

(57) ABSTRACT

A heat dissipation plate has a structural body including a first metal portion formed from a first metal and a second metal portion formed from a second metal that differs from the first metal and bonded to the first metal portion through solid state bonding. The first metal has a higher thermal conductance than the second metal, and the second metal has a higher mechanical strength than the first metal. The structural body includes a first surface of the heat dissipation plate connected to a semiconductor element and a second surface of the heat dissipation plate located at a side opposite to the first surface. The second surface includes an upper surface of the first metal portion and an upper surface of the second metal portion.

19 Claims, 14 Drawing Sheets

(51) Int. Cl.
*H01L 23/00* (2006.01)
*H01L 23/13* (2006.01)
*H01L 23/36* (2006.01)

(52) U.S. Cl.
CPC .............. *H01L 23/36* (2013.01); *H01L 24/32* (2013.01); *H01L 24/73* (2013.01); *H01L 2224/32245* (2013.01); *H01L 2224/73204* (2013.01); *H01L 2224/73253* (2013.01)

(58) Field of Classification Search
CPC . H01L 23/3672; H01L 21/4882; H01L 23/13; H01L 23/36; G06F 1/20
See application file for complete search history.

(56) References Cited

U.S. PATENT DOCUMENTS

2013/0081796 A1    4/2013   Horiuchi
2019/0164864 A1*   5/2019   Arvin ................ H01L 23/3736

* cited by examiner

HEAT DISSIPATION PLATE AND SEMICONDUCTOR DEVICE

CROSS-REFERENCE TO RELATED APPLICATIONS

This application is based upon and claims the benefit of priority from prior Japanese Patent Application No. 2020-204355, filed on Dec. 9, 2020, the entire contents of which are incorporated herein by reference.

FIELD

The present disclosure relates to a heat dissipation plate and a semiconductor device.

BACKGROUND

Semiconductor elements are used in central processing units (CPUs). Such semiconductor elements are becoming faster and more sophisticated year by year. This has increased the amount of heat generated by the semiconductor elements. An increase in the amount of generated heat raises the temperature of a semiconductor element. This may lower the operational speed of the semiconductor element or cause a defect in the semiconductor element.

Japanese Laid-Open Patent Publication No. 2013-77598 describes a semiconductor element that includes a structure for dissipating heat from a semiconductor element to cool the semiconductor element. The semiconductor device includes a semiconductor element mounted on a wiring substrate and a heat dissipation plate connected by an adhesive to the semiconductor element. The heat dissipation plate is formed from a metal having high thermal conductance. In this case, the heat generated by the semiconductor element, which is subject to cooling, is transferred through the adhesive to the heat dissipation plate and dissipated into the atmosphere from the heat dissipation plate. This efficiently dissipates heat from the semiconductor element and limits increases in the temperature of the semiconductor element.

SUMMARY

When the mechanical strength of the heat dissipation plate is low, warping of the wiring substrate may deform the heat dissipation plate. To obtain sufficient mechanical strength for the heat dissipation plate, the thickness of the heat dissipation plate may be increased. However, this will enlarge the entire semiconductor device.

One aspect of the present disclosure is a heat dissipation plate including a structural body. The structural body includes a first metal portion formed from a first metal and a second metal portion formed from a second metal that differs from the first metal and is bonded to the first metal portion through solid state bonding. The first metal has a higher thermal conductance than the second metal, and the second metal has a higher mechanical strength than the first metal. The structural body includes a first surface of the heat dissipation plate connected to a semiconductor element and a second surface of the heat dissipation plate located at a side opposite to the first surface. The second surface includes an upper surface of the first metal portion and an upper surface of the second metal portion.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
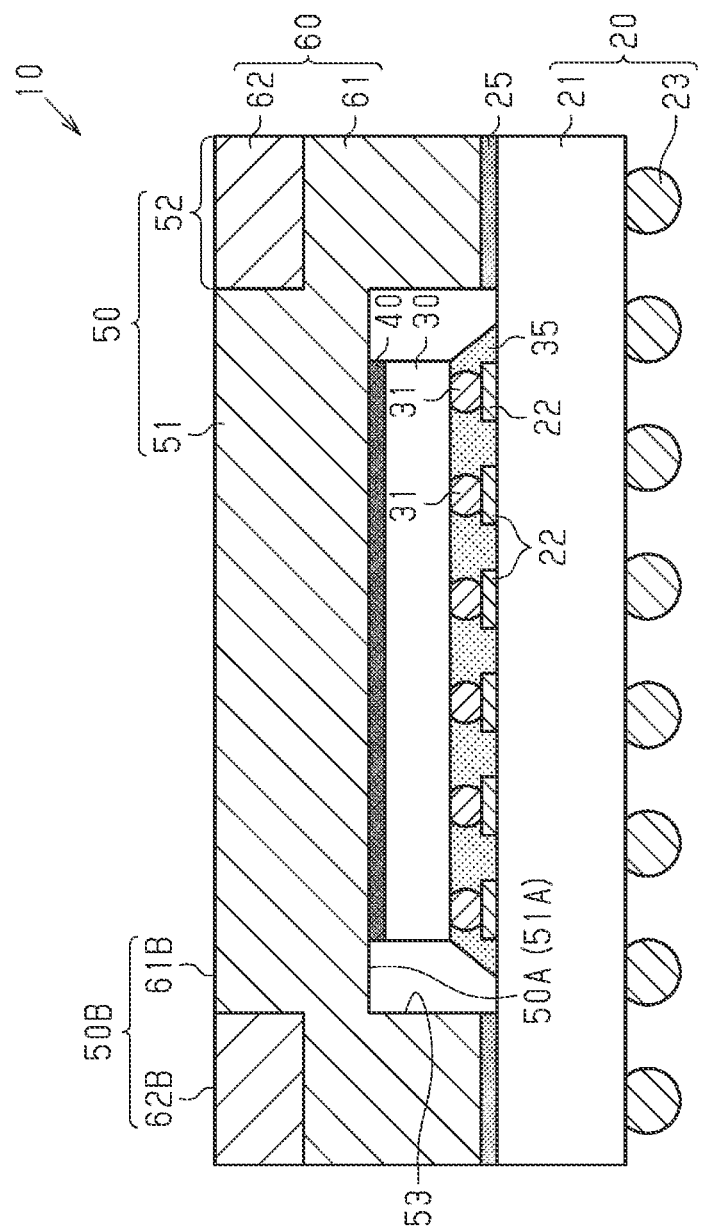
FIG. 1 is a schematic cross-sectional view of a semiconductor device in accordance with a first embodiment.

Embodiments will now be described with reference to the drawings. In the accompanying drawings, elements are illustrated for simplicity and clarity and have not necessarily been drawn to scale. To facilitate understanding, hatching lines may not be illustrated or may be replaced by shadings in the cross-sectional drawings.

The structure of a semiconductor device 10 will now be described with reference to FIG. 1.

The semiconductor device 10 includes a wiring substrate 20, one or more semiconductor elements 30 (one in this case) mounted on the wiring substrate 20, and a heat dissipation plate 50 arranged above the semiconductor element 30. An adhesive 40 is applied between the heat dissipation plate 50 and the semiconductor element 30.

The wiring substrate 20 includes, for example, a substrate body 21, connection pads 22, and solder balls 23. The substrate body 21 may have any structure as long as the connection pads 22 and the solder balls 23 are electrically connected through the substrate body 21. Thus, a wiring layer may or may not be formed inside the substrate body 21. When forming a wiring layer inside the substrate body 21, for example, inner wiring layers may be stacked with insulative interlayers arranged between adjacent inner wiring layers. In this case, the connection pads 22 and the solder balls 23 may be electrically connected by the inner layers and via wires, which are formed in the insulative interlayers. When a wiring layer is not formed inside the substrate body 21, for example, the connection pads 22 and the solder balls 23 may be electrically connected by through-electrodes extending through the substrate body 21 in a thickness direction. The substrate body 21 may be, for example, a core buildup substrate that includes a core substrate or a coreless substrate that does not have a core substrate. The substrate body 21 may have a thickness of, for example, about 50 μm to 200 μm.

The connection pads 22 are formed on the upper surface of the substrate body 21. The material of the connection pads 22 may be, for example, copper (Cu) or a copper alloy.

The solder balls 23 are formed on the lower surface of the substrate body 21. The material of the solder balls 23 may be, for example, an alloy including lead (Pb), an alloy of tin (Sn) and Cu, an alloy of Sn and silver (Ag), an alloy of Sn, Ag, and Cu, or the like. The solder balls 23 function as, for example, external connection terminals connected to a motherboard or the like.

The semiconductor element 30 includes, for example, a semiconductor integrated circuit (not illustrated) formed on a thin semiconductor substrate of silicon (Si). The semiconductor element 30 includes a circuit formation surface that is defined by the surface on which the semiconductor integrated circuit is formed (lower surface in FIG. 1). The circuit formation surface is covered by a passivation film. Connection terminals 31 are arranged on the circuit formation surface. The connection terminals 31, which extend through the passivation film, are connected to the semiconductor integrated circuit.

The semiconductor element 30 may be, for example, a logic chip such as a central processing unit (CPU) chip or a graphics processing unit (GPU) chip. Further, the semiconductor element 30 may be, for example, a memory chip such as a dynamic random access memory (DRAM) chip or a flash memory chip. The semiconductor element 30 may have any shape and size in plan view. The semiconductor element 30 may be, for example, square in plan view. The size of the semiconductor element 30 may be dimensioned to be, for example, approximately 10 mm×10 mm in plan view. The semiconductor element 30 may have a thickness of, for example, approximately 10 μm to 100 μm.

The semiconductor element 30 is, for example, flip chip mounted on the wiring substrate 20. The semiconductor element 30 is electrically connected by the connection terminals 31 to the connection pads 22 of the wiring substrate 20. The connection terminals 31 may be, for example, gold (Au) bumps or solder bumps. The material of the solder bumps may be, for example, an alloy including Pb, an alloy of Sn and Cu, an alloy of Sn and Ag, or an alloy of Sn, Ag, and Cu.

A gap between the lower surface (circuit formation surface) of the semiconductor element 30 and the upper surface of the substrate body 21 is filled with an underfill resin 35. The material of the underfill resin 35 may be, for example, an insulative resin such as an epoxy resin.

The adhesive 40 is formed on a back surface (upper surface in FIG. 1) of the semiconductor element 30 at the side opposite to the circuit formation surface. The adhesive 40 may be, for example, a silicon polymer resin or a thermal interface material (TIM). The thermal interface material may be, for example, indium (In) or the like that has high thermal conductance and high electrical conductance. The thermal interface material may also be, for example, silicon grease including a material having high electrical conductance or a resin binder including a metal filler or graphite. The adhesive 40 adheres the semiconductor element 30 and the heat dissipation plate 50, and thermally connects the semiconductor element 30 and the heat dissipation plate 50. The material of the adhesive 40 has high thermal conductance so as to efficiently transfer the heat of the semiconductor element 30 to the heat dissipation plate 50. The adhesive 40 may have a thickness of, for example, approximately 20 μm to 30 μm.

The heat dissipation plate 50 is arranged on the back surface of the semiconductor element 30 with the adhesive 40 arranged in between. The heat dissipation plate 50 is also referred to as a heat spreader. The heat dissipation plate 50 lowers the concentration of the heat generated by the semiconductor element 30. When the heat dissipation plate 50 is, for example, arranged on the semiconductor element 30, the heat dissipation plate 50 mechanically protects the semiconductor element 30. The heat dissipation plate 50 includes a first surface 50A connected to the semiconductor element 30 and a second surface 50B (upper surface in FIG. 1) at the side opposite to the first surface 50A.

The heat dissipation plate 50 is, for example, bonded to the wiring substrate 20. For example, the heat dissipation plate 50 is bonded to the upper surface of the substrate body 21 by a bonding member 25. The heat dissipation plate 50 is bonded by the bonding member 25 to, for example, the peripheral portion of the upper surface of the substrate body 21 so as to surround the semiconductor element 30. The material of the bonding member 25 may be, for example, a silicon polymer resin.

The heat dissipation plate 50 includes, for example, a main body 51, which is flat, and a side wall 52, which is formed integrally with the main body 51. The main body 51 includes the first surface 50A of the heat dissipation plate 50. In the example of FIG. 1, the main body 51 includes a lower surface 51A that corresponds to the first surface 50A of the heat dissipation plate 50. The lower surface 51A of the main body 51 is thermally coupled by the adhesive 40 to the back surface of the semiconductor element 30. The main body 51 is shaped to be slightly larger than, for example, the semiconductor element 30 in plan view. For example, the main body 51 is shaped to be slightly smaller than the substrate body 21 in plan view.

The side wall 52 is arranged along the periphery of the main body 51. The side wall 52 is formed integrally with the side of the main body 51. The side wall 52 extends in, for example, a direction intersecting the planar direction of the main body 51. In FIG. 1, the side wall 52 extends in a vertical direction that intersects the horizontal direction, or planar direction. In the present example, the side wall 52 extends in a direction orthogonal to the upper surface and lower surface 51A (first surface 50A) of the main body 51. Thus, the side wall 52 extends in the thickness direction of the main body 51. The side wall 52 covers the side of the main body 51 (refer to FIG. 2). The side wall 52, for example, entirely covers the side of the main body 51. The lower portion of the side wall 52 projects downward from the lower surface 51A of the main body 51. The lower surface of the side wall 52 is bonded by the bonding member 25 to the substrate body 21.

Figure 2:
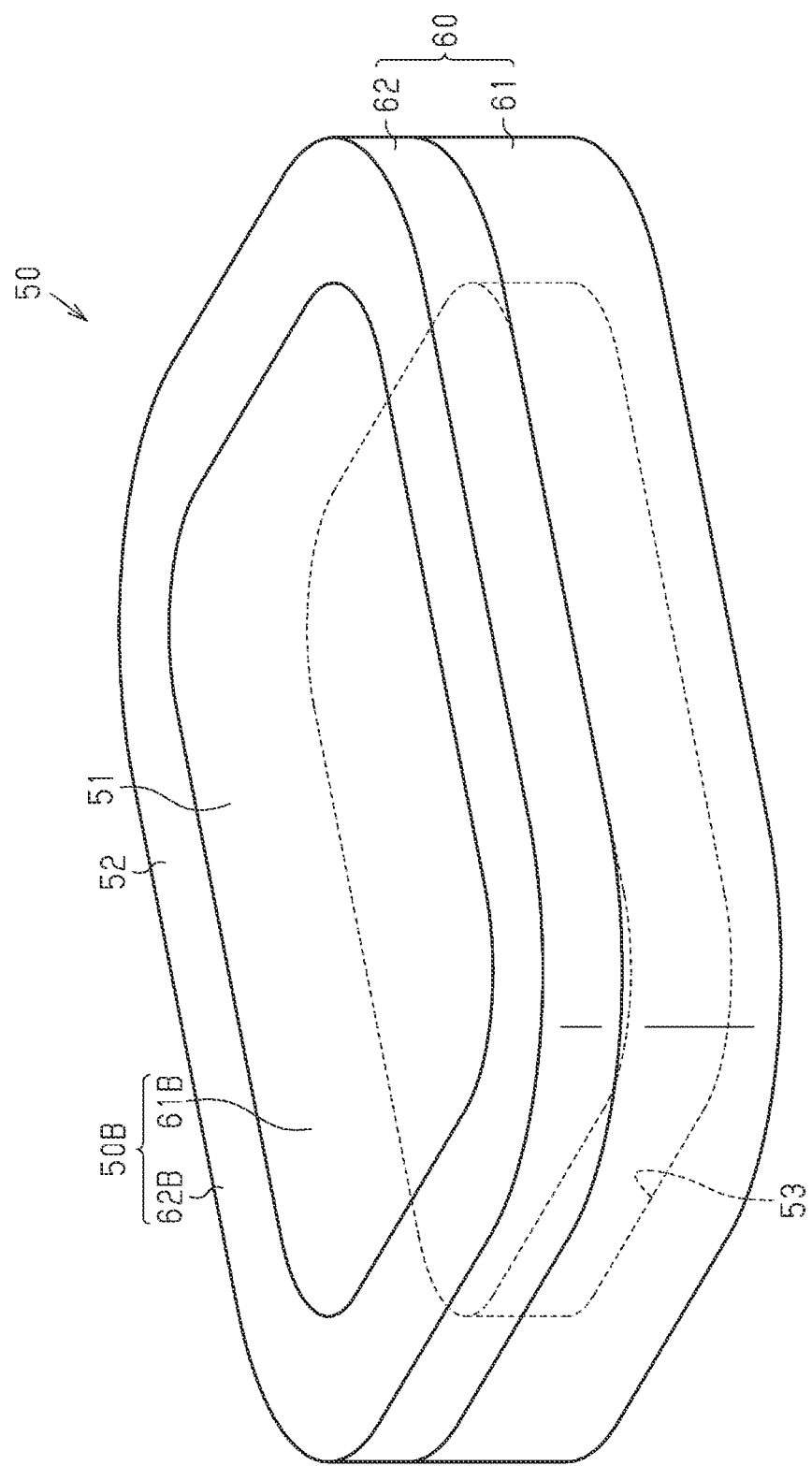
FIG. 2 is a schematic perspective view of a heat dissipation plate in accordance with a first embodiment.

In the example illustrated in FIG. 2, the side wall 52 is formed continuously around the entire periphery of the main body 51. The side wall 52 has, for example, a frame-shaped form. The side wall 52 surrounds, for example, the semiconductor element 30 illustrated in FIG. 1 from the outer side.

As illustrated in FIG. 1, the heat dissipation plate 50 includes a recess 53 defined by the lower surface MA of the main body 51 and the lower portion of the side wall 52. The recess 53 and the wiring substrate 20 define an accommodation compartment that accommodates the semiconductor element 30. The lower surface MA of the main body 51 defines a bottom surface of the recess 53, and the back surface of the semiconductor element 30 is thermally coupled to the bottom surface of the recess 53 by the adhesive 40. The adhesive 40 transfers the heat of the semiconductor element 30 to the heat dissipation plate 50.

The heat dissipation plate 50 has a structural body 60 including a first metal portion 61 and a second metal portion 62 directly bonded to the first metal portion 61 through solid state bonding. The structural body 60 includes the first surface 50A of the heat dissipation plate 50 and the second surface 50B of the heat dissipation plate 50. In the example of FIG. 1, the first surface 50A of the heat dissipation plate 50 is defined by the first metal portion 61. Further, the second surface 50B of the heat dissipation plate 50 includes an upper surface 61B of the first metal portion 61 and an upper surface 62B of the second metal portion 62. The first metal portion 61 is integrated with the second metal portion 62 through solid state bonding. Solid state bonding is a method that first heats and softens bonded subjects in a solid (solid phase) state without melting the bonded subjects. The method then further heats the bonded subjects to plastically deform and bond together the bonded subjects. Examples of solid state bonding include diffusion bonding, pressure bonding, friction bonding, and ultrasonic bonding. In the drawings, the first metal portion 61 and the second metal portion 62 are illustrated using solid lines so that they can be easily distinguished from each other. The integration of the first metal portion 61 and the second metal portion 62 through diffusion bonding may eliminate, for example, the interface of the first metal portion 61 and the second metal portion 62. Thus, the boundary of the first metal portion 61 and the second metal portion 62 may not be clear.

The first metal portion 61 and the second metal portion 62 are formed from different metal materials. The first metal portion 61 is formed from a first metal. The second metal portion 62 is formed from a second metal that differs from the first metal. The first metal has a higher thermal conductance than the second metal. Examples of the first metal include, for example, a metal such as copper or aluminum or an alloy including at least one of these metals. The second metal has a higher mechanical strength (rigidity, hardness, or the like) than the first metal. Examples of the second metal include, for example, a metal such as copper or iron, or an alloy such as a copper alloy or an iron alloy. Other examples of the second metal include bronze or stainless steel.

Most of the heat dissipation plate 50 is formed by the first metal portion 61. The second metal portion 62 serves as a reinforcement forming part of the heat dissipation plate 50. The second metal portion 62 defines, for example, part of the second surface 50B of the heat dissipation plate 50. The second metal portion 62 is exposed to the outside as part of the second surface 50B of the heat dissipation plate 50.

Among the main body 51 and the side wall 52, the second metal portion 62 is included in, for example, only the side wall 52. In other words, the main body 51 is formed by only the first metal portion 61. The second metal portion 62 is defined by, for example, an upper portion of the side wall 52. In the example of FIG. 1, the upper portion of the side wall 52 is defined by the second metal portion 62, and a portion of the side wall 52 excluding the upper portion is defined by the first metal portion 61. That is, the side wall 52 includes the peripheral part of the first metal portion 61 and the second metal portion 62 that is bonded to the upper surface of the peripheral part of the first metal portion 61. The second metal portion 62 is formed integrally with the upper surface of the peripheral part of the first metal portion 61.

In this manner, the main body 51 and a portion of the side wall 52 (portion of side wall 52 excluding upper portion) is formed by the first metal portion 61 in the heat dissipation plate 50. The lower portion of the side wall 52 is formed by the first metal portion 61, and the first metal portion 61 is bonded by the bonding member 25 to the substrate body 21. The bottom surface of the recess 53 (i.e., lower surface 51A of main body 51) is formed by the first metal portion 61, and the side surface of the recess 53 (i.e., inner surface of lower portion of side wall 52) is formed by the first metal portion 61. Accordingly, the surfaces (bottom surface and side surface) of the recess 53 are formed by only the first metal portion 61.

In the example of FIG. 1, the upper surface of the side wall 52 is flush with the upper surface of the main body 51. That is, the upper surface 62B of the second metal portion 62 is flush with the upper surface 61B of the first metal portion 61. The upper surface 61B of the first metal portion 61 and the upper surface 62B of the second metal portion 62 define the second surface 50B of the heat dissipation plate 50. Accordingly, the second surface 50B of the heat dissipation plate 50 includes the upper surface 61B of the first metal portion 61 and the upper surface 62B of the second metal portion 62.

The second metal portion 62 covers part of the side surface of the main body 51. Since the main body 51 is formed by the first metal portion 61, the second metal portion 62 is formed integrally with the first metal portion 61 (part of side surface of main body 51). The second metal portion 62 has a thickness that is, for example, less than that of the main body 51. The thickness of the second metal portion 62 is less than, for example, the depth of the recess 53. The thickness of the second metal portion 62 may be, for example, approximately 0.5 mm to 1.0 mm. The thickness of the main body 51 may be, for example, approximately 1.0 mm to 2.0 mm. The depth of the recess 53 may be, for example, approximately 0.6 mm to 1.2 mm.

As illustrated in FIG. 2, the second metal portion 62, for example, extends continuously over the entire side wall 52. The second metal portion 62, for example, extends continuously along the periphery of the main body 51 around an entirety of the main body 51. The second metal portion 62 has, for example, a frame-shaped form. The second metal portion 62 surrounds the main body 51 from the outer side in plan view. The second metal portion 62 has a width that is the same as that of the side wall 52. In other words, the upper portion of the side wall 52 is formed by only the second metal portion 62. The outer side surface of the second metal portion 62 is, for example, flush with the outer side surface of the first metal portion 61 that forms the side wall 52.

As illustrated in FIG. 1, the first metal portion 61 is formed by integrating the main body 51 and part of the side wall 52 so as to connect the lower portion of the main body 51 (portion including lower surface 51A) to part of the side wall 52 (portion excluding upper portion of side wall 52). The first metal portion 61 forming the side wall 52 has a thickness that is, for example, greater than or equal to that of the main body 51. The thickness of the first metal portion 61, which forms the side wall 52, may be, for example, approximately 1.0 mm to 2.5 mm.

Method for manufacturing semiconductor device 10

A method for manufacturing the semiconductor device 10 will now be described. To simplify illustration, portions that will become elements of the semiconductor device 10 are given the same reference characters as the corresponding elements in the final semiconductor device 10.

With reference to FIG. 3A to FIG. 5B, a method for manufacturing the heat dissipation plate 50 will first be described.

Figure 3A:
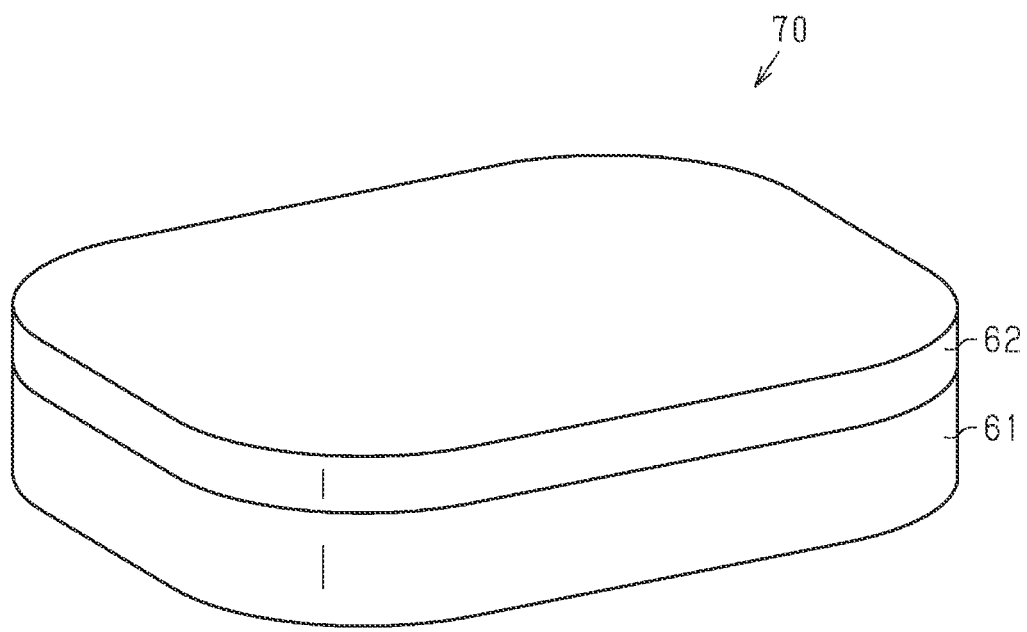
FIG. 3A is a schematic perspective view illustrating a method for manufacturing the heat dissipation plate illustrated in FIG. 2.
Figure 3B:
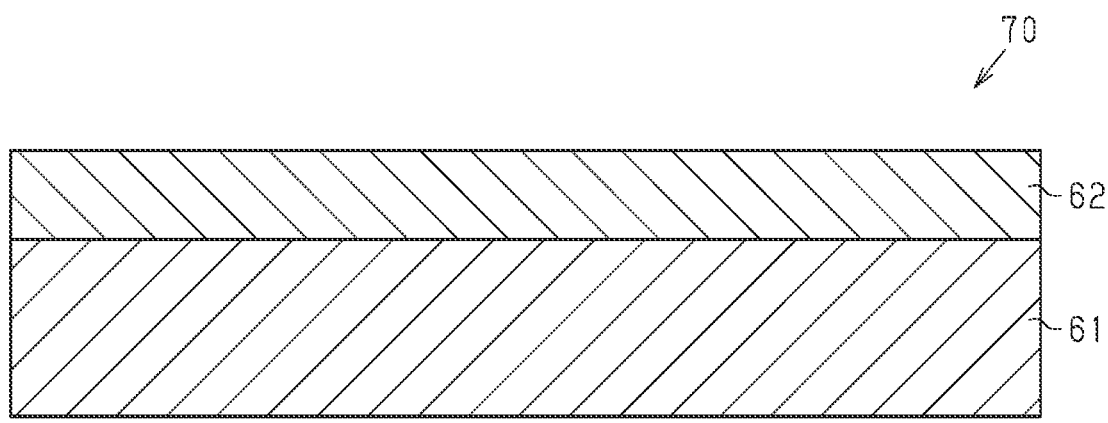
FIG. 3B is a schematic cross-sectional view of the heat dissipation plate illustrated in FIG. 3A.

As illustrated in FIGS. 3A and 3B, the flat second metal portion 62 is arranged on the upper surface of the flat first metal portion 61. The first metal portion 61 may have a thickness of, for example, approximately 1.0 mm to 2.5 mm. Further, the second metal portion 62 may have a thickness of, for example, approximately 0.5 mm to 1.0 mm.

Then, the first metal portion 61 and the second metal portion 62 are heated to a given temperature (for example, approximately 900° C.) and pressed to bond the first metal portion 61 and the second metal portion 62 through solid state bonding. This directly bonds the upper surface of the first metal portion 61 to the lower surface of the second metal portion 62 and integrates the first metal portion 61 and the second metal portion 62 into a flat plate. As a result, the first metal portion 61 and the second metal portion 62 are integrated through solid state bonding into a structural body 70. The structural body 70 is also referred to as clad material or clad metal.

Figure 4A:
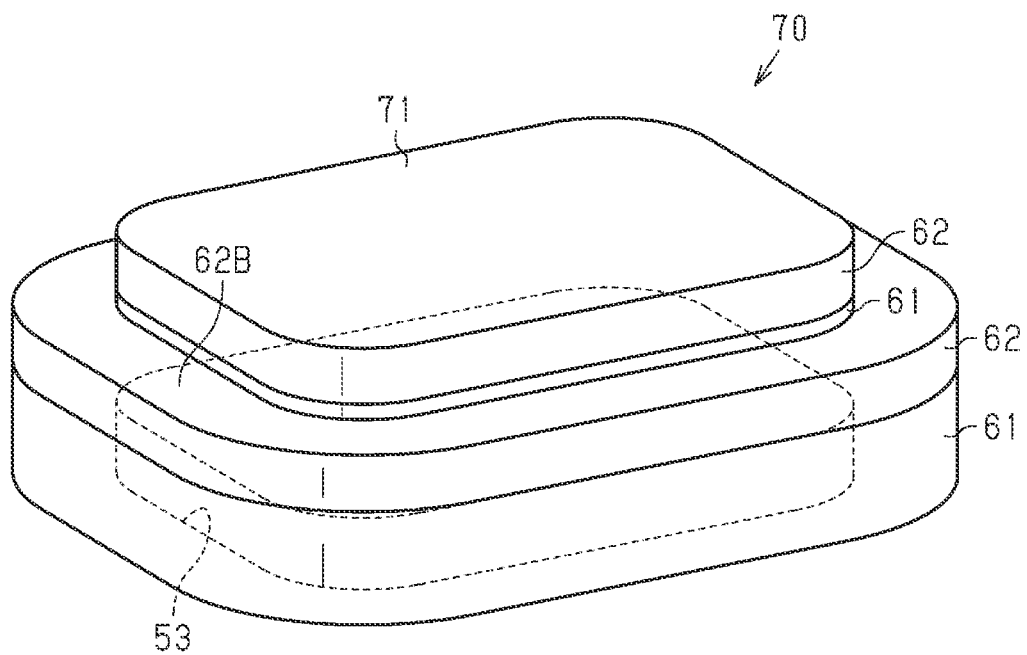
FIG. 4A is a schematic perspective view illustrating the method for manufacturing the heat dissipation plate in a step following the step illustrated in FIG. 3A.
Figure 4B:
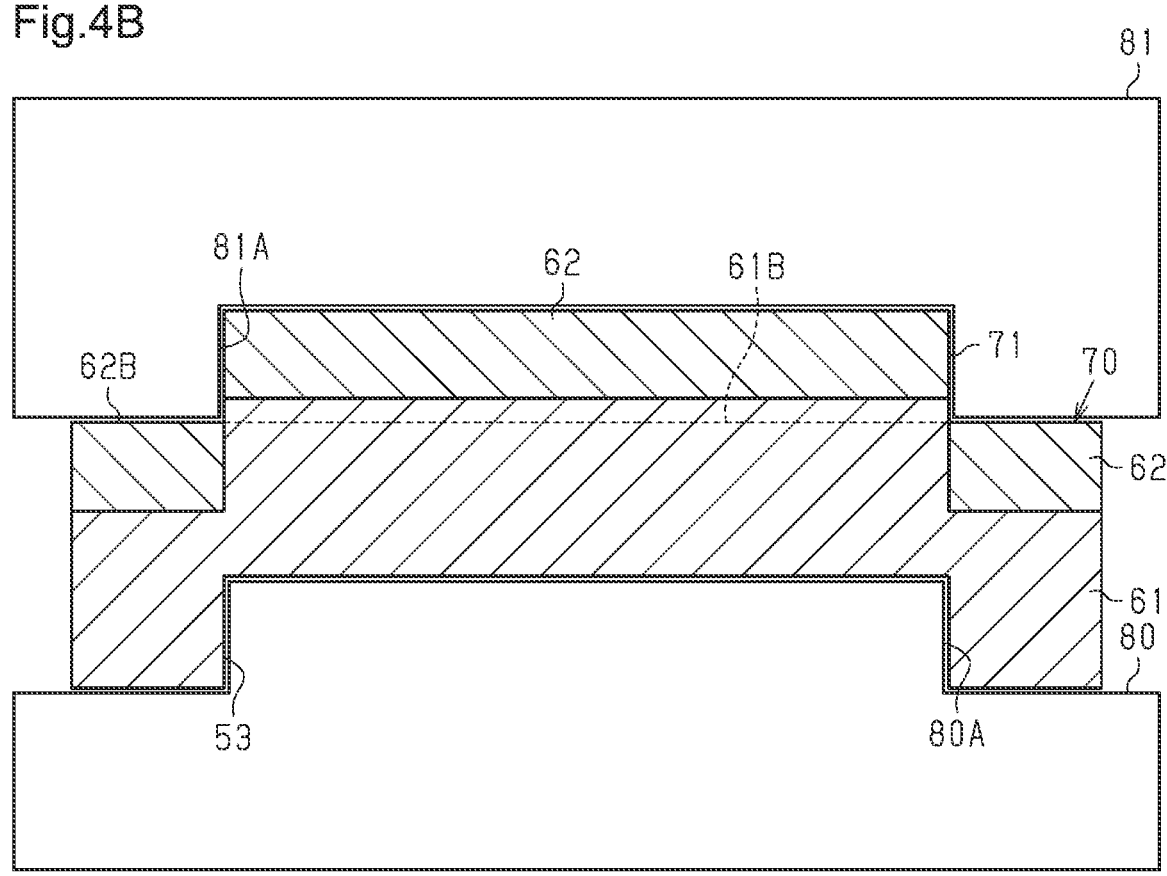
FIG. 4B is a schematic cross-sectional view illustrating one example of the method for manufacturing the heat dissipation plate illustrated in FIG. 4A.

In the step illustrated in FIGS. 4A and 4B, for example, dies are used to perform stamping so that the peripheral portion of the structural body 70 is projected downward from the central portion of the structural body 70. For example, as illustrated in FIG. 4B, a lower die 80 and an upper die 81 are prepared as the dies. The upper surface of the lower die 80 includes a protrusion 80A. The lower surface of the upper die 81 includes a cavity 81A. The protrusion 80A and the cavity 81A are located at overlapping positions in plan view. The protrusion 80A and the cavity 81A each have a shape and size in plan view that correspond to the shape and size of the central portion of the structural body 70 excluding the peripheral portion of the structural body 70. In a state in which the structural body 70 is placed between the lower die 80 and the upper die 81, the protrusion 80A of the lower die 80 is upwardly pressed against the central portion of the structural body 70. Thus, the central portion of the structural body 70 is raised from the peripheral portion. In other words, the peripheral portion of the structural body 70 is lowered from the central portion. This forms a projection 71 that projects above the upper surface 62B of the second metal portion 62 located at the peripheral portion of the structural body 70. Simultaneously, the recess 53 is formed in the lower surface of the first metal portion 61 at the central portion of the structural body 70. The recess 53 is recessed upward from the position where the lower surface of the first metal portion 61 is located at the peripheral portion of the structural body 70. The projection 71 is projected upward by an amount corresponding to the depth of the recess 53 from the position where the upper surface 62B of the second metal portion 62 is located at the peripheral portion of the structural body 70. In the example of FIG. 1, the projection 71 results in the upper part of the first metal portion 61 located at the central portion of the structural body 70 projecting upward from the position where the upper surface 62B of the second metal portion 62 is located at the peripheral portion of the structural body 70. Thus, the formation of the projection 71 separates the second metal portion 62 located at the central portion of the structural body 70 from the second metal portion 62 located at the peripheral portion of the structural body 70.

Then, the projection 71 is, for example, machined and removed from the structural body 70. For example, the second metal portion 62 is machined and removed from the projection 71. In the example of FIG. 4B, the projection 71 includes the second metal portion 62 located at the central portion of the structural body 70 and part of the first metal portion 61 located underneath the second metal portion 62 at the central portion of the structural body 70. The entire projection 71 is machined and removed. This forms the upper surface 62B of the second metal portion 62, located at the peripheral portion of the structural body 70, and the upper surface 61B of the first metal portion 61 (refer to broken line in FIG. 4B), located at the central portion of the structural body 70. The upper surface 61B of the first metal portion 61 is flush with the upper surface 62B of the second metal portion 62. Part of the upper surface 62B of the second metal portion 62 may be machined in the peripheral portion of the structural body 70.

Figure 5A:
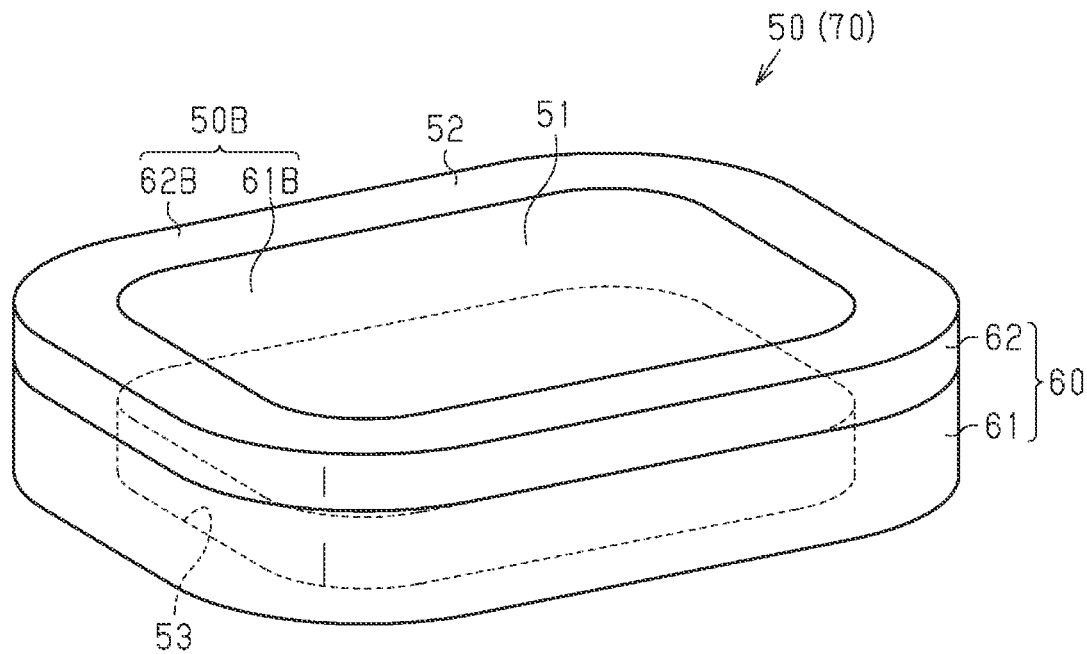
FIG. 5A is a schematic perspective view illustrating the method for manufacturing the heat dissipation plate in a step following the step illustrated in FIG. 4A.
Figure 5B:
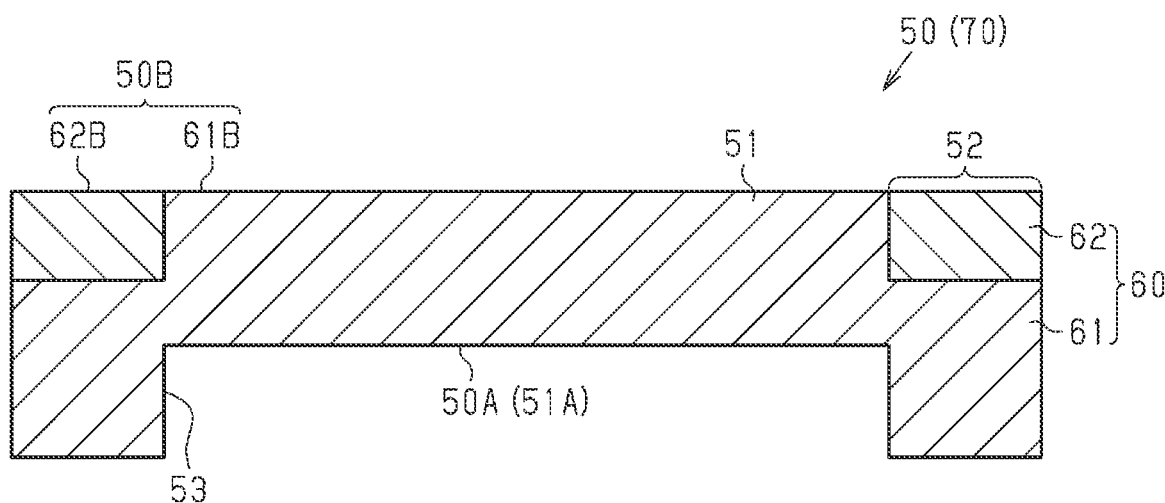
FIG. 5B is a schematic cross-sectional view of the heat dissipation plate illustrated in FIG. 5A.

As a result, as illustrated in FIGS. 5A and 5B, the upper surface 61B of the first metal portion 61 located at the central portion of the structural body 70 is exposed to the outside together with the upper surface 62B of the second metal portion 62 located at the peripheral portion of the structural body 70. In this example, the upper surface 61B of the first metal portion 61 located at the central portion of the structural body 70 is flush with the upper surface 62B of the second metal portion 62 located at the peripheral portion of the structural body 70.

The heat dissipation plate 50 illustrated in FIGS. 1 and 2 are manufactured through the manufacturing steps described above. That is, the heat dissipation plate 50 is manufactured including the structural body 60 in which the first metal portion 61 and the second metal portion 62 are integrated through solid state bonding. The heat dissipation plate 50 (structural body 60) includes the main body 51, the side wall 52, and the recess 53.

Figure 6:
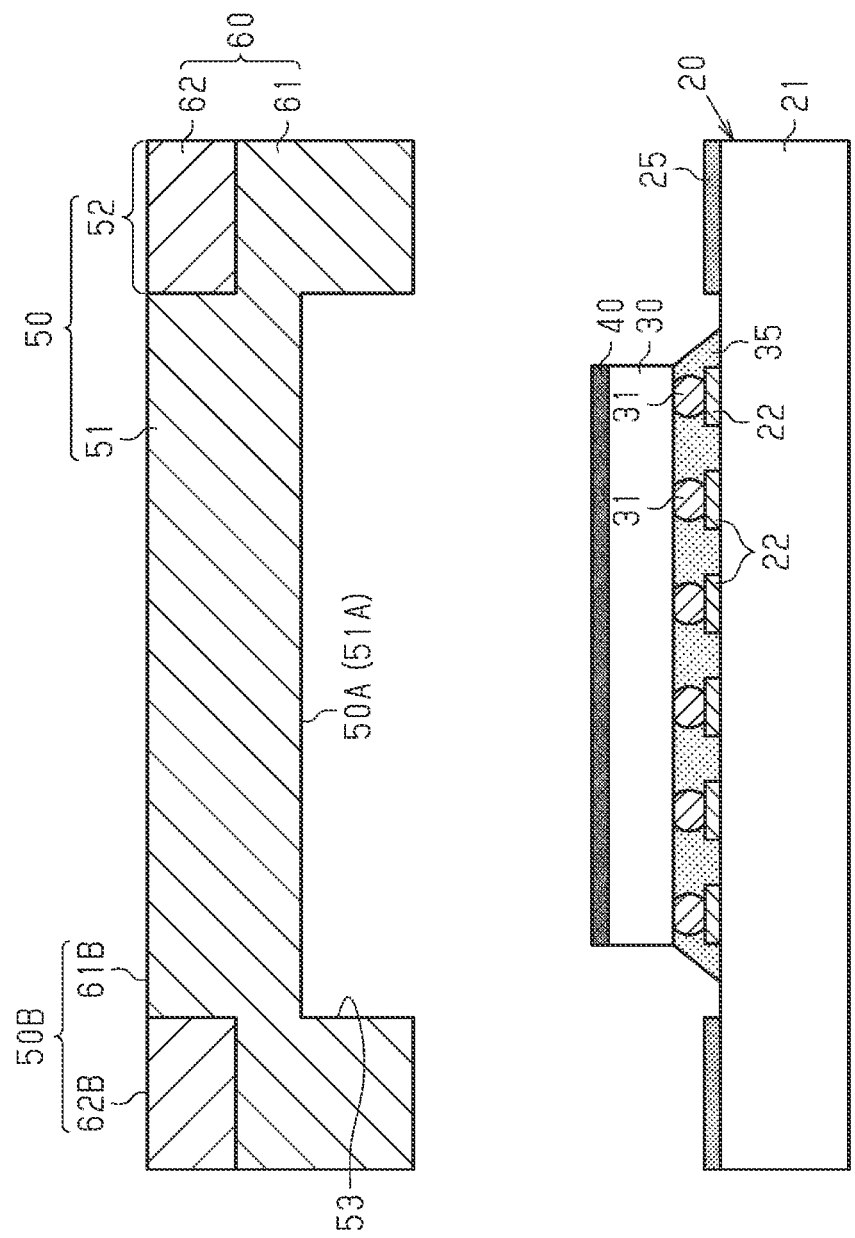
FIG. 6 is a schematic cross-sectional view illustrating the method for manufacturing the semiconductor device illustrated in FIG. 1 following the step illustrated in FIG. 5A.

Next, in the step illustrated in FIG. 6, the wiring substrate 20 on which the semiconductor element 30 is mounted is prepared. An example of a method for manufacturing the wiring substrate 20 will now be briefly described. The wiring substrate 20 includes the connection pads 22. The connection terminals 31 of the semiconductor element 30 are flip chip bonded to the connection pads 22, which are formed on the upper surface of the wiring substrate 20. Then, the underfill resin 35 is formed in the gap between the wiring substrate 20 and the semiconductor element 30.

In the step illustrated in FIG. 6, a thermosetting bonding member 25 is applied in a frame-like manner to the peripheral edges of the upper surface of the wiring substrate 20. The adhesive 40 is formed on the back surface of the semiconductor element 30. For example, a thermosetting adhesive 40 is applied to the back surface of the semiconductor element 30. Then, the heat dissipation plate 50 is arranged on the wiring substrate 20 and the semiconductor element 30 so that the lower surface of the side wall 52 of the heat dissipation plate 50 faces the bonding member 25 and so that the lower surface 51A of the main body 51 faces the adhesive 40.

The wiring substrate 20, the heat dissipation plate 50, and the adhesive 40 are heated and pressed in a state arranged as described above. Consequently, as illustrated in FIG. 1, the heat dissipation plate 50 is bonded by the bonding member 25 to the wiring substrate 20, and the heat dissipation plate 50 is bonded by the adhesive 40 to the semiconductor element 30. Then, the solder balls 23 are formed on the lower surface of the wiring substrate 20 to manufacture the semiconductor device 10 illustrated in FIG. 1.

The advantages of the embodiment will now be described.

(1) The heat dissipation plate 50 includes the structural body 60 in which the first metal portion 61 and the second metal portion 62 are bonded through solid state bonding. The first metal portion 61 is formed from the first metal, and the second metal portion 62 is formed from the second metal. The first metal has a higher thermal conductance than the second metal, and the second metal has a higher mechanical strength than the first metal. With this structure, the arrangement of the second metal portion 62 increases the mechanical strength of the entire heat dissipation plate 50 as compared with when the heat dissipation plate 50 includes only the first metal portion 61. Further, the arrangement of the second metal portion 62 increases the mechanical strength of the entire heat dissipation plate 50 without increasing the thickness of the heat dissipation plate 50. Thus, the mechanical strength of the heat dissipation plate 50 is increased without enlarging the heat dissipation plate 50.

(2) The first metal portion 61 and the second metal portion 62 are bonded through solid state bonding. Since an adhesive is not used to adhere the first metal portion 61 to the second metal portion 62, enlargement of the heat dissipation plate 50 that would occur when using such adhesive is avoided.

(3) Among the main body 51 and the side wall 52, the second metal portion 62 is included in only the side wall 52. In other words, the main body 51 that includes the first surface 50A connected to the semiconductor element 30 does not include the second metal portion 62 that has a lower thermal conductance than the first metal portion 61. Thus, the heat dissipation performance of the heat dissipation plate 50 is unaffected by the second metal portion 62.

(4) The second metal portion 62 extends continuously around the entire periphery of the main body 51. Accordingly, the second metal portion 62 that has a relatively high mechanical strength is arranged around the entire main body 51. This allows the semiconductor device 10 to effectively resist stress that acts in various directions to warp the semiconductor device 10, and effectively reduces warping of the semiconductor device 10.

(5) The upper surface 62B of the second metal portion 62 is flush with the upper surface 61B of the first metal portion 61, which forms the main body 51. Thus, when heat dissipation components, such as heat dissipation fins, are disposed on the second surface 50B of the heat dissipation plate 50, the heat dissipation fins can contact the upper surface 62B of the second metal portion 62. This allows heat to be transferred through the first metal portion 61 and the second metal portion 62 to the heat dissipation components. Thus, heat is effectively transferred to the heat dissipation components.

It should be apparent to those skilled in the art that the foregoing embodiments may be implemented in many other specific forms without departing from the scope of this disclosure. Particularly, it should be understood that the foregoing embodiments may be implemented in the following forms.

The heat dissipation plate 50 may be partially or entirely surface-processed. For example, the heat dissipation plate 50 may include an outermost metal layer that is formed on an entirety of all surfaces of the heat dissipation plate 50 through surface-processing. Examples of the surface-processing include nickel (Ni) plating or a combination of Ni plating and partial gold (Au) plating on the Ni plating. Thus, the heat dissipation plate 50 may include the outermost metal layer formed by an Ni layer or a combination of an Ni layer and a partial Au layer. In this case, the outermost meal layer may form the first surface 50A and the second surface 50B of the heat dissipation plate 50.

The above-described embodiment and the modified examples described below may be combined as long as there is no technical contradiction.

Figure 7:
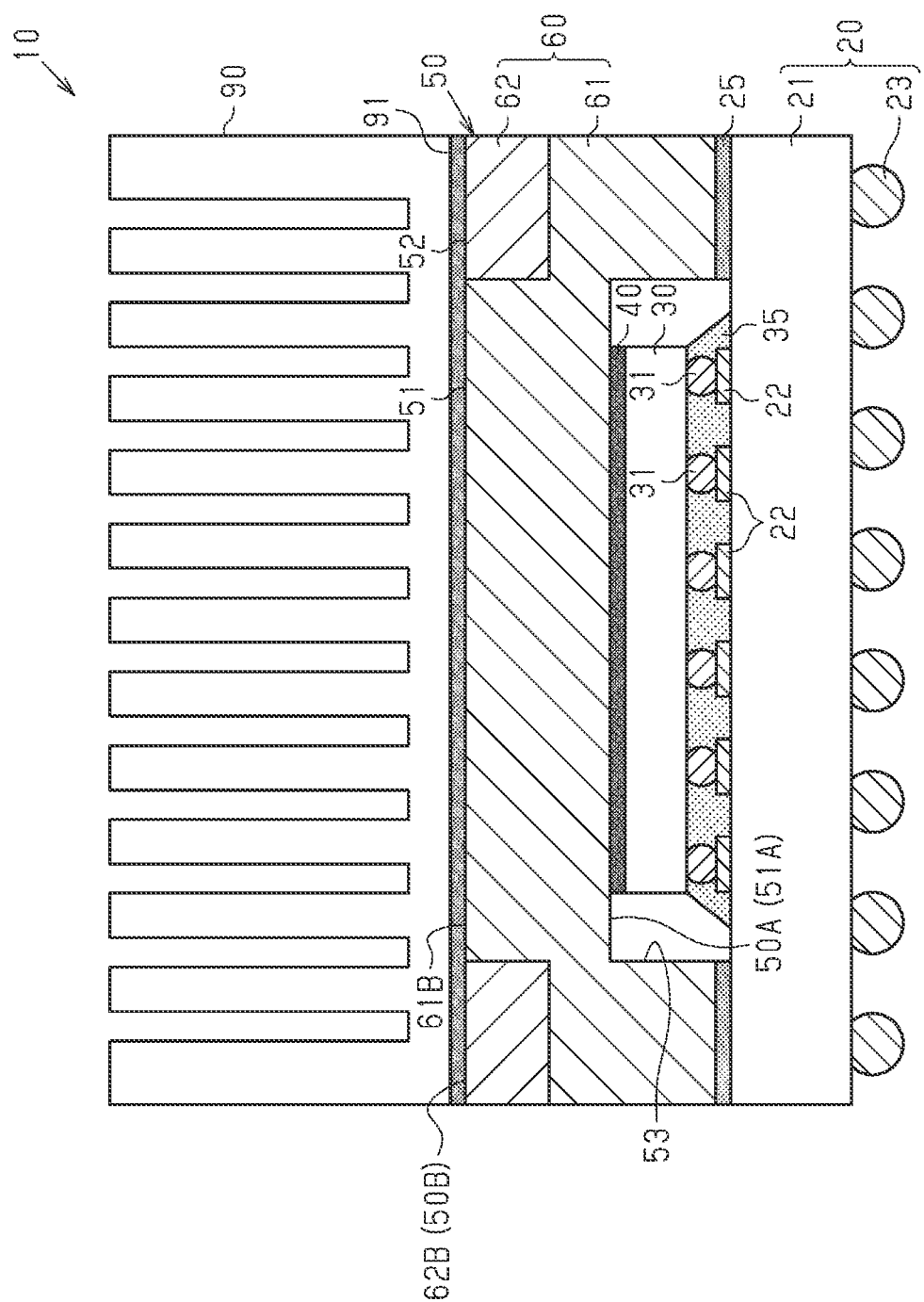
FIGS. 7, 8, 9, 10, and 11 are schematic cross-sectional views illustrating various modified examples of the semiconductor device.

As illustrated in FIG. 7, the semiconductor device 10 may further include a heat dissipation component 90. The heat dissipation component 90 is connected to the second surface 50B of the heat dissipation plate 50 by, for example, an adhesive 91. The heat dissipation component 90 includes heat dissipation fins and have a fin structure to efficiently dissipate heat into the atmosphere. The material of the heat dissipation component 90 may be, for example, aluminum or an aluminum alloy. The adhesive 91 may be, for example, the same as the adhesive 40.

The heat dissipation component 90 covers, for example, the entire surface of the second surface 50B of the heat dissipation plate 50. The heat dissipation component 90 is connected by, for example, the adhesive 91 to the upper surface 61B of the first metal portion 61 and the upper surface 62B of the second metal portion 62.

With this structure, the heat generated by the semiconductor element 30 is transferred through the heat dissipation plate 50 to the heat dissipation component 90 and released from the heat dissipation component 90 into the atmosphere. This efficiently dissipates the heat generated by the semiconductor element 30 and limits increases in the temperature of the semiconductor element 30.

Instead of heat dissipation fins, a heat pipe or a vapor chamber may be used as the heat dissipation component 90 of FIG. 7.

In the above embodiment, the side surface of the recess 53 extends orthogonal to the upper surface of the main body 51 but it does not have to be orthogonal.

Figure 8:
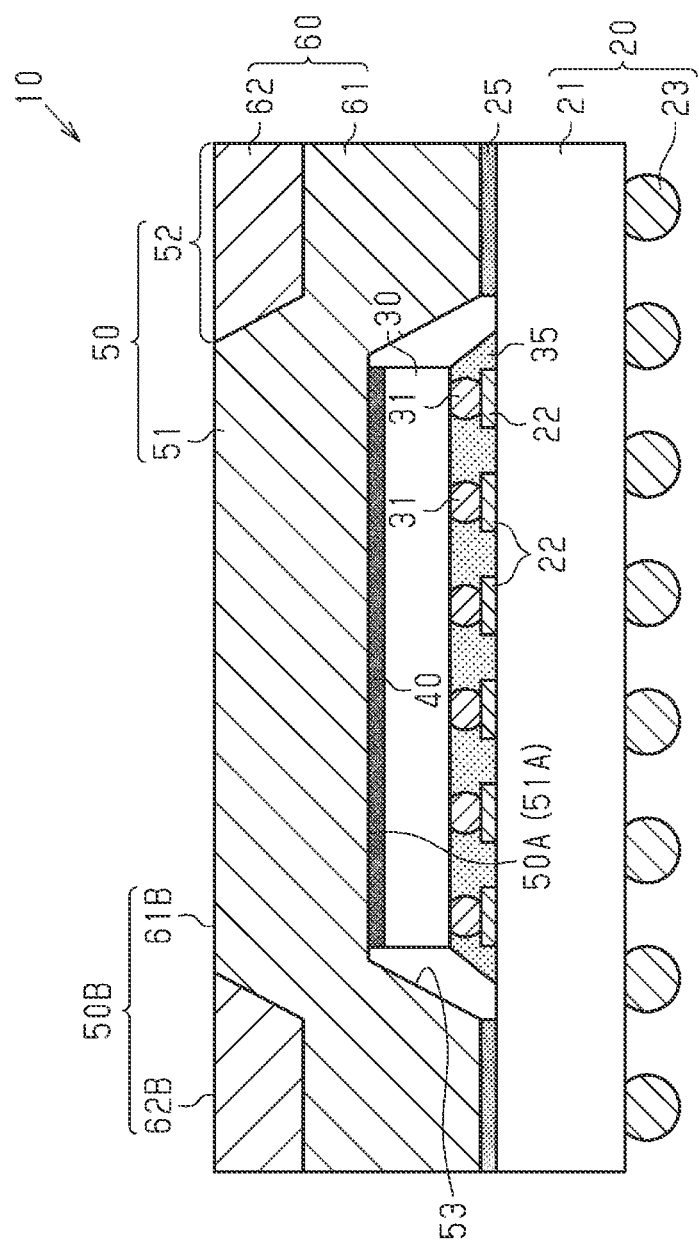

For example, as illustrated in FIG. 8, the side surface of the recess 53 may be inclined. For example, the side surface of the recess 53 may be inclined from the lower surface 51A of the main body 51 so that the outer edge of the heat dissipation plate 50 becomes closer as the lower surface of the side wall 52 becomes closer. In other words, the side surface of the recess 53 may be inclined from the lower surface 51A of the main body 51 so that the semiconductor element 30 becomes farther as the lower surface of the side wall 52 becomes closer.

In the above embodiment, the outer surface of the side wall 52 extends orthogonal to the upper surface of the main body 51 but does not have to be orthogonal. For example, the outer side surface of the side wall 52 may be inclined. For example, the outer side surface of the side wall 52 may be inclined from the upper surface of the side wall 52 so that the semiconductor element 30 becomes farther as the lower surface of the side wall 52 becomes closer.

Figure 9:
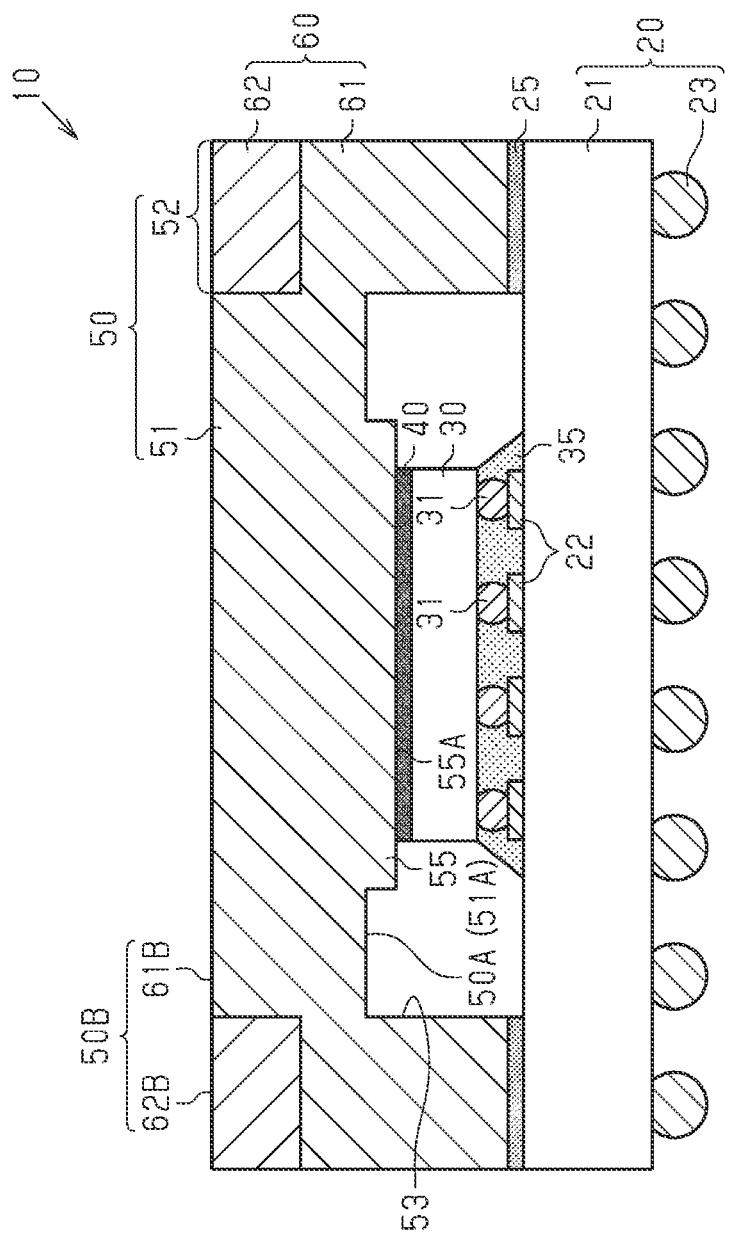

As illustrated in FIG. 9, the lower surface 51A of the main body 51 (i.e., bottom surface of recess 53) may include a projection 55 that projects downward from the lower surface 51A. The projection 55 projects toward the semiconductor element 30 from the lower surface 51A of the main body 51. In this case, a lower surface 55A of the projection 55 is bonded by the adhesive 40 to the semiconductor element 30.

In the above embodiment, the semiconductor element 30 is flip chip mounted on the wiring substrate 20. However, the mounting of the semiconductor element 30 is not limited to flip chip mounting. For instance, instead of flip chip mounting, the semiconductor element 30 may be mounted through, for example, wire bonding or soldering.

Figure 10:
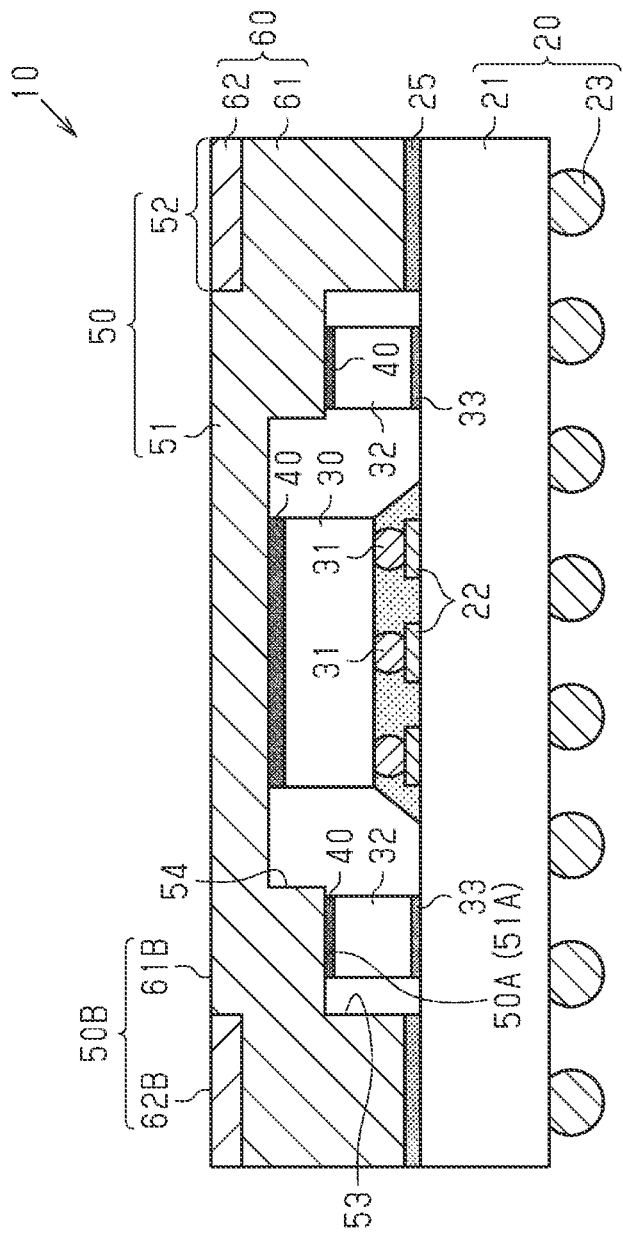

As illustrated in FIG. 10, electronic components 30 and 32 may be mounted on the wiring substrate 20. For example, the electronic components 30 and 32 may have different heights. In the example of FIG. 10, the semiconductor element 30 and two electronic components 32 that are shorter than the semiconductor element 30 are mounted on the wiring substrate 20. The electronic components 32 are mounted on, for example, the upper surface of the substrate body 21 with solder 33. The upper surfaces of the electronic components 32 are connected by the adhesive 40 to the first surface 50A of the heat dissipation plate 50. The electronic components 32 do not have to be solder mounted and may be, for example, flip chip mounted or mounted through wire bonding. Each electronic component 32 may be, for example, a semiconductor chip, an active component such as a transistor or a diode, and/or a passive component such as a chip capacitor, a chip inductor, or a chip resistor.

The first surface 50A of the heat dissipation plate 50 includes a recess 54 recessed upward from the lower surface 51A of the main body 51. The recess 54 accommodates the semiconductor element 30, which is taller than the electronic components 32. The upper surface of the semiconductor element 30 is connected by the adhesive 40 to the bottom surface of the recess 54. In the modified example of FIG. 10, the lower surface 51A of the main body 51 and the bottom surface of the recess 54 define the first surface 50A of the heat dissipation plate 50.

In the above embodiment, in the second surface 50B of the heat dissipation plate 50, the upper surface 62B of the second metal portion 62 is flush with the upper surface 61B of the first metal portion 61 but does not have to be flush with the upper surface 61B of the first metal portion 61.

Figure 11:
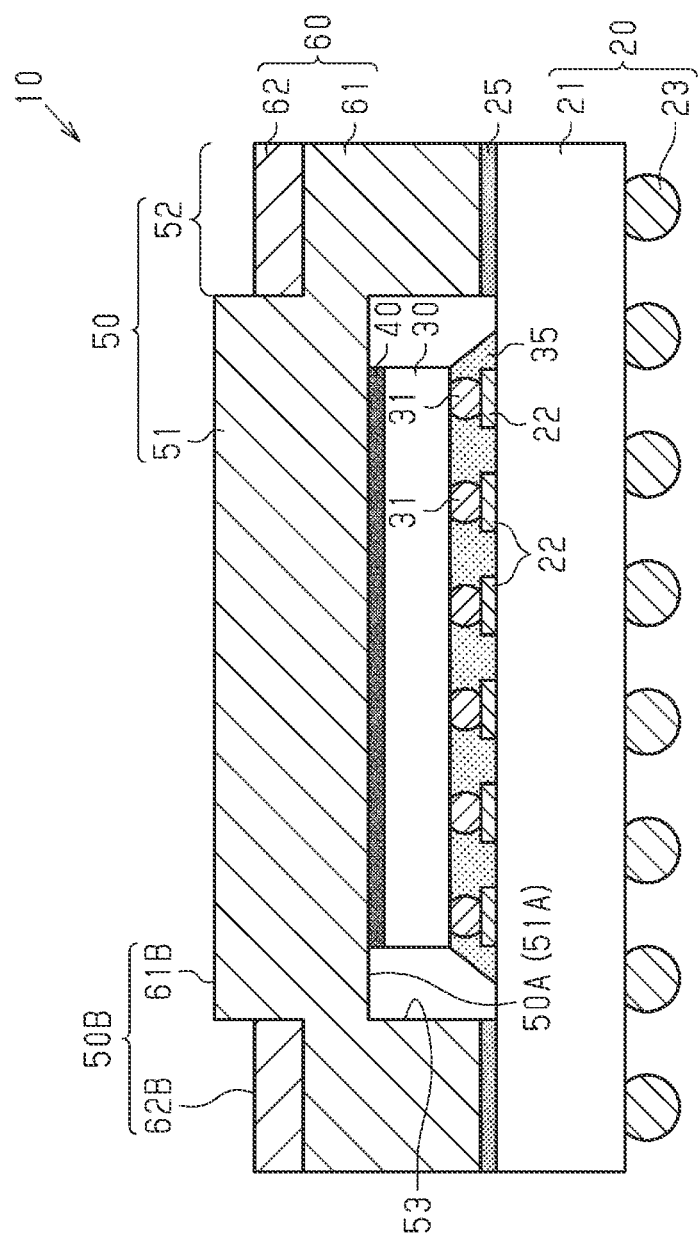

For example, as illustrated in FIG. 11, in the second surface 50B of the heat dissipation plate 50, the upper surface 62B of the second metal portion 62 may be located at a lower position than the upper surface 61B of the first metal portion 61, which forms the main body 51. In this case, the upper portion of the main body 51 projects upward from the upper surface 62B of the second metal portion 62. Thus, the side surface of the main body 51 is exposed from the second metal portion 62. In the modified example of FIG. 11, in the second surface 50B of the heat dissipation plate 50, a step is formed by the upper surface 61B of the first metal portion 61 forming the main body 51 and the upper surface 62B of the second metal portion 62.

In the above embodiment, the second metal portion 62 extends continuously around the entire periphery of the heat dissipation plate 50 but may be formed, for example, on only part of the periphery of the heat dissipation plate 50.

Figure 12:
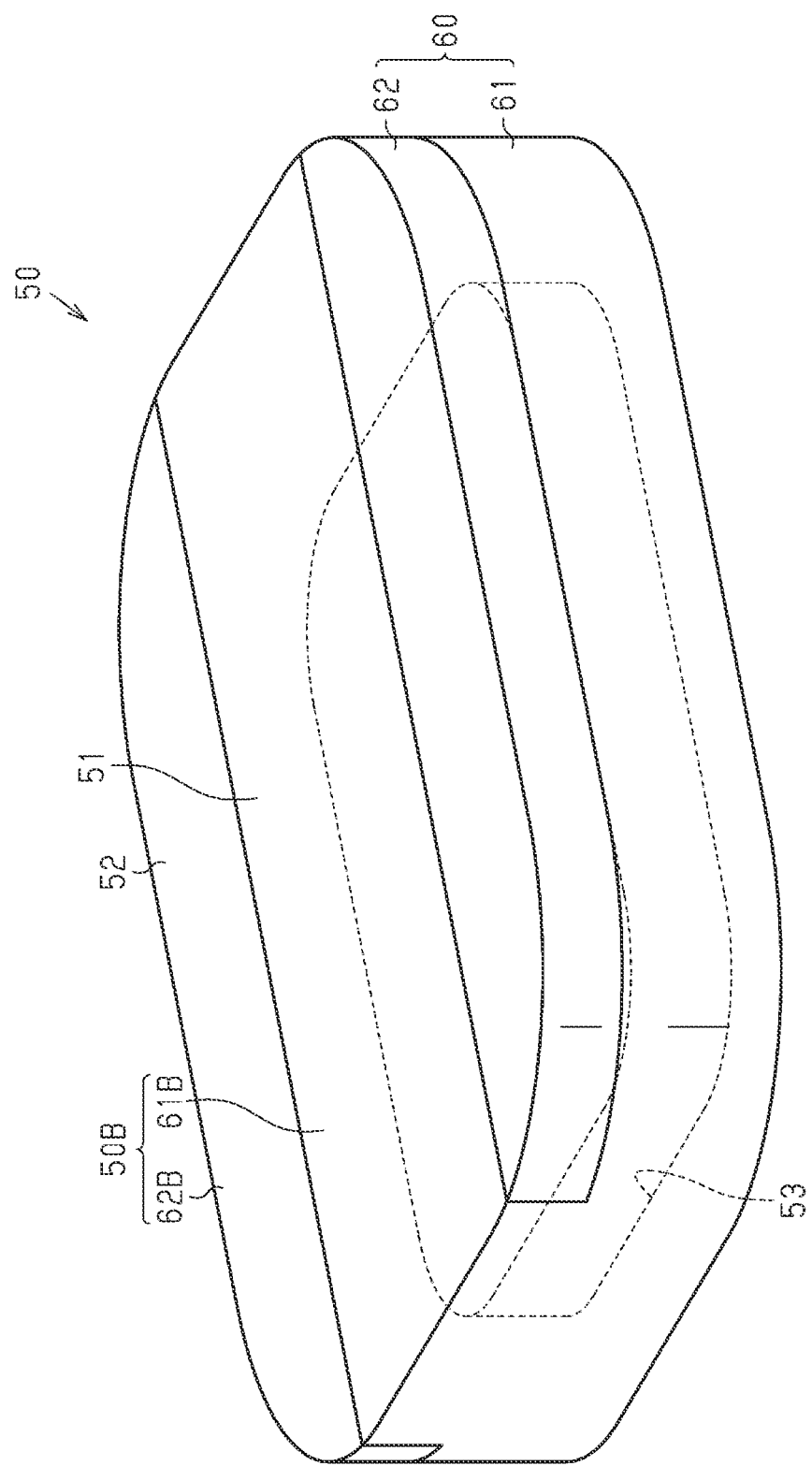
FIGS. 12 and 13 are schematic perspective views illustrating various modified examples of the heat dissipation plate.

For example, as illustrated in FIG. 12, the second metal portion 62 may be arranged on only two of the four sides of the heat dissipation plate 50. In the modified example of FIG. 12, among the four sides of the heat dissipation plate 50, the second metal portion 62 is arranged to extend along two opposing sides. Alternatively, the second metal portion 62 may be arranged on only one of the four sides of the heat dissipation plate 50.

In the above embodiment, among the main body 51 and the side wall 52, the second metal portion 62 is included in only the side wall 52 but may be included in, for example, both of the main body 51 and the side wall 52.

In the above embodiment, the second metal portion 62 is arranged on and bonded to the upper surface of the first metal portion 61 in the thickness direction of the heat dissipation plate 50. However, the arrangement of the second metal portion 62 may be changed.

Figure 13:
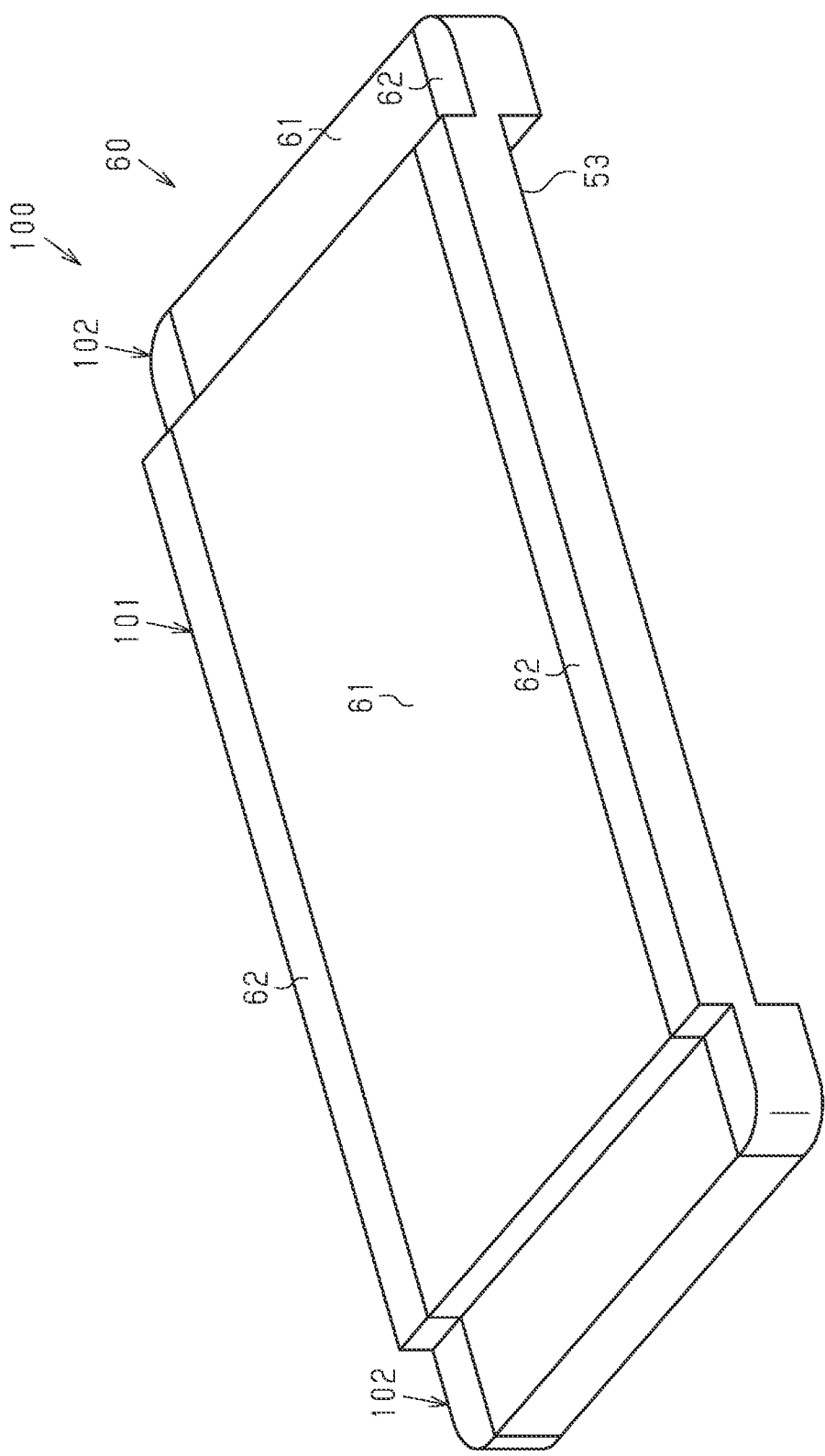

As illustrated in FIG. 13, for example, the second metal portion 62 may be arranged on the side surfaces of the first metal portion 61 with respect to the widthwise direction of a heat dissipation plate 100 and directly bonded to the first metal portion 61 through solid state bonding. In the modified example of FIG. 13, the heat dissipation plate 100 is rectangular and includes two long sides and two short sides in plan view. The direction in which the short sides of the heat dissipation plate 100 extend is the widthwise direction of the heat dissipation plate 100, and the direction in which the long sides of the heat dissipation plate 100 extend is the longitudinal direction of the heat dissipation plate 100. In the example of FIG. 13, the first metal portion 61 is rectangular and includes long sides and short sides in plan view. The second metal portion 62 is, for example, bonded to the side surfaces of the first metal portion 61, or the long sides of the first metal portion 61. That is, the second metal portion 62 is bonded to the side surfaces of the first metal portion 61 extending in the longitudinal direction of the heat dissipation plate 100. Further, in the example of FIG. 13, two second metal portions 62 are bonded to the side surfaces of the first metal portion 61 so as to sandwich the first metal portion 61 from two opposite sides in the widthwise direction of the heat dissipation plate 100. The second metal portion 62 is not bonded to the side surfaces of the first metal portion 61 that are the short sides of the first metal portion 61.

The heat dissipation plate 100 includes a main body 101 and two outer side walls 102 that are located at the two ends in the longitudinal direction of the heat dissipation plate 100. Further, the heat dissipation plate 100 includes the recess 53 that is defined by the lower surface of the main body 101 and the lower portions of the side walls 102. That is, the main body 101 is arranged between the two side walls 102 in the longitudinal direction of the heat dissipation plate 100. The main body 101 includes two second metal portions 62, arranged at two sides with respect to the widthwise direction of the heat dissipation plate 100, and the first metal portion 61, arranged between the two second metal portions 62. The two second metal portions 62 of the main body 101 extend from the upper surface of the main body 101 to the lower surface of the main body 101. Namely, each second metal portion 62 forming the main body 101 extends in the thickness direction over the entire length of the main body 101. In the same manner, the first metal portion 61 of the main body 101 extends from the upper surface of the main body 101 to the lower surface of the main body 101. Namely, the first metal portion 61 of the main body 101 extends in the thickness direction over the entire length of the main body 101.

Each side wall 102 includes two second metal portions 62, arranged at the two sides with respect to the widthwise direction of the heat dissipation plate 100, and the first metal portion 61, arranged between the two second metal portions 62. The two second metal portions 62 of each side wall 102 extend from the upper surface of the side wall 102 to the lower surface of the side wall 102. Namely, the second metal portions 62 of each side wall 102 extend vertically over an entirety of the side wall 102. In the same manner, the first metal portion 61 of each side wall 102 extends from the upper surface of the side wall 102 to the lower surface of the side wall 102. Namely, the first metal portion 61 of each side wall 102 extends vertically over an entirety of the side wall 102.

This structure also increases the mechanical strength of the heat dissipation plate 100 by bonding the second metal portions 62 to the side surfaces of the first metal portion 61. The wiring substrate bonded to the heat dissipation plate 100 tends to warp in the longitudinal direction. In this respect, in the heat dissipation plate 100 of the modified example illustrated in FIG. 13, the second metal portion 62 is bonded to the side surfaces of the first metal portion 61, which extends in the longitudinal direction. This structure effectively counters stress acting to warp the heat dissipation plate 100 in the longitudinal direction and effectively limits warping of the heat dissipation plate 100.

A method for manufacturing the heat dissipation plate 100 will now be described.

Figure 14:
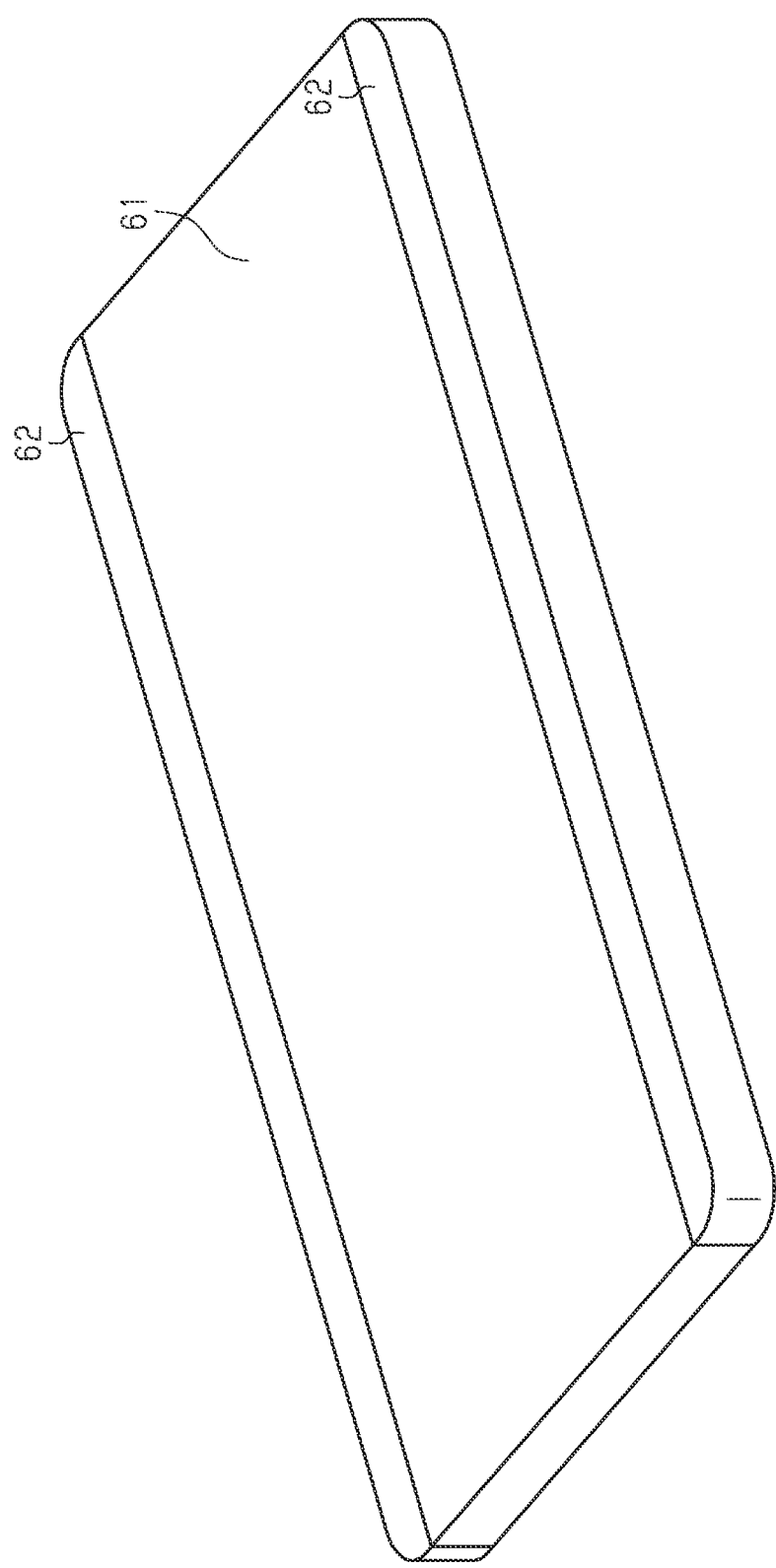
FIG. 14 is a schematic perspective view illustrating a method for manufacturing the heat dissipation plate illustrated in FIG. 13.

First, as illustrated in FIG. 14, the flat second metal portions 62 are arranged on the side surfaces of the flat first metal portion 61. In the example of FIG. 14, the two second metal portions 62 are arranged on the first metal portion 61 to sandwich the first metal portion 61 from two sides in the widthwise direction of the first metal portion 61.

Then, the first metal portion 61 and the two second metal portions 62 are heated to a given temperature (e.g., approximately 900° C.) in the state arranged together and pressed to bond the first metal portion 61 and the two second metal portions 62 through solid state bonding. This directly bonds one of the side surfaces of the first metal portion 61 to one of the second metal portions 62 and the other side surface of the first metal portion 61 to the other second metal portion 62. This step obtains a structural body (clad material) integrating the first metal portion 61 and the two second metal portions 62 in the widthwise direction of the first metal portion 61 through solid state bonding.

Then, the structural body illustrated in FIG. 14 is stamped with dies so that the two longitudinal ends project downward from the longitudinally middle portion. This manufactures the heat dissipation plate 100 illustrated in FIG. 13.

In the modified example illustrated in FIG. 13, the second metal portion 62 is arranged on the two widthwise sides of the heat dissipation plate 100. Instead, the second metal portion 62 may be arranged on, for example, only one widthwise side of the heat dissipation plate 100.

In the modified example of FIG. 13, the second metal portion 62 is bonded to the side surfaces of the first metal portion 61 extending in the longitudinal direction of the heat dissipation plate 100. Instead, the second metal portion 62 may be bonded to, for example, the side surfaces of the first metal portion 61 extending in the widthwise direction of the heat dissipation plate 100.

In the above embodiment, the heat dissipation plate 50 is formed by the structural body 60 that bonds two types of metal, or the first metal portion 61 and the second metal portion 62, through solid state bonding. Instead, the heat dissipation plate 50 may be formed by a structural body that bonds three or more types of metal, such as first, second, and third metal portions, through solid state bonding.

In the above embodiment, the wiring substrate 20 is a ball grid array (BGA) wiring substrate but may also be, for example, a pin grid array (PGA) wiring substrate or a land grid array (LGA) wiring substrate.

CLAUSES

This disclosure further encompasses the following embodiments.

1. A method for manufacturing a heat dissipation plate, the method including: arranging, on an upper surface of a first metal portion formed from a first metal, a second metal portion formed from a second metal that differs from the first metal;

forming a structural body by bonding the first metal portion and the second metal portion through solid state bonding;

stamping the structural body to form a recess and a projection at a central portion of the structural body, wherein the recess is formed in a lower surface of the first metal portion located at the central portion of the structural body and the projection projects above an upper surface of the second metal portion located at a peripheral portion of the structural body; and machining and removing the second metal portion from the projection, in which the first metal has a thermal conductance that is higher than that of the second material, and the second metal has a mechanical strength that is higher than that of the first metal.

2. The method according to clause 1, in which the machining includes machining the projection so that the upper surface of the second metal portion located at the peripheral portion of the structural body is flush with the upper surface of the first metal portion located at the central portion of the structural body.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A heat dissipation plate, comprising:
a structural body including a first metal portion formed from a first metal and a second metal portion formed from a second metal that differs from the first metal and is solid state bonded to the first metal portion, wherein
the first metal has a thermal conductance that is higher than that of the second metal,
the second metal has a mechanical strength that is higher than that of the first metal,
the structural body includes a first surface of the heat dissipation plate arranged for connection to a semiconductor element and a second surface of the heat dissipation plate located at a side opposite to the first surface,
the second surface includes an upper surface of the first metal portion and an upper surface of the second metal portion, and
the second metal portion is directly bonded to the first metal portion without another member between the first and second metal portions.

2. The heat dissipation plate according to claim 1, further comprising:
a main body including the first surface; and
a side wall arranged on a periphery of the main body and formed integrally with the main body,
wherein part of the side wall is formed by the second metal portion.

3. The heat dissipation plate according to claim 2, wherein the second metal portion is formed continuously along the periphery of the main body around an entirety of the main body.

4. The heat dissipation plate according to claim 2, wherein at least part of the main body is formed by the first metal portion.

5. The heat dissipation plate according to claim 2, wherein the upper surface of the second metal portion is flush with the upper surface of the first metal portion.

6. The heat dissipation plate according to claim 2, wherein:
the main body includes a lower surface that is the first surface;
the side wall includes a lower portion that projects downward from the lower surface of the main body; and
the heat dissipation plate includes a recess formed by the lower surface of the main body and the lower portion of the side wall.

7. The heat dissipation plate according to claim 6, wherein a surface of the recess is formed in only the first metal portion.

8. The heat dissipation plate according to claim 6, wherein the recess includes a side surface that is inclined relative to the lower surface of the main body.

9. The heat dissipation plate according to claim 2, wherein:
the main body is formed by the first metal portion;
the side wall includes an upper portion formed by the second metal portion and a lower portion formed by the first metal portion;
the upper surface of the first metal portion is an upper surface of the main body, and
the upper surface of the second metal portion is an upper surface of the upper portion of the side wall.

10. The heat dissipation plate according to claim 2, wherein the second metal portion extends vertically over an entirety of the side wall.

11. The heat dissipation plate according to claim 1, wherein:
the first metal portion is formed from copper or an alloy including copper; and
the second metal portion is formed from iron or an alloy including iron.

12. A semiconductor device, comprising:
the heat dissipation plate according to claim 1;
a wiring substrate; and
a semiconductor element mounted on the wiring substrate,
wherein the first surface of the heat dissipation plate is connected to an upper surface of the semiconductor element by an adhesive.

13. A heat dissipation plate, comprising:
a structural body including a first metal portion formed from a first metal and a second metal portion formed from a second metal that differs from the first metal and is solid state bonded to the first metal portion, wherein
the first metal has a thermal conductance that is higher than that of the second metal,
the second metal has a mechanical strength that is higher than that of the first metal,
the structural body includes a first surface of the heat dissipation plate arranged for connection to a semiconductor element and a second surface of the heat dissipation plate located at a side opposite to the first surface,
the second surface includes an upper surface of the first metal portion and an upper surface of the second metal portion,
the heat dissipation plate further comprises:
a main body including the first surface; and
a side wall arranged on a periphery of the main body and formed integrally with the main body,
part of the side wall is formed by the second metal portion, and
the second metal portion is formed continuously along the periphery of the main body around an entirety of the main body.

14. The heat dissipation plate according to claim 13, wherein at least part of the main body is formed by the first metal portion.

15. The heat dissipation plate according to claim 13, wherein the upper surface of the second metal portion is flush with the upper surface of the first metal portion.

16. The heat dissipation plate according to claim 13, wherein:
the main body includes a lower surface that is the first surface;
the side wall includes a lower portion that projects downward from the lower surface of the main body; and
the heat dissipation plate includes a recess formed by the lower surface of the main body and the lower portion of the side wall.

17. The heat dissipation plate according to claim 16, wherein a surface of the recess is formed in only the first metal portion.

18. The heat dissipation plate according to claim 16, wherein the recess includes a side surface that is inclined relative to the lower surface of the main body.

19. The heat dissipation plate according to claim 13, wherein:
the main body is formed by the first metal portion;
the side wall includes an upper portion formed by the second metal portion and a lower portion formed by the first metal portion;
the upper surface of the first metal portion is an upper surface of the main body, and
the upper surface of the second metal portion is an upper surface of the upper portion of the side wall.

* * * * *